(12) United States Patent
Chang

(10) Patent No.: US 8,614,892 B2
(45) Date of Patent: Dec. 24, 2013

(54) SERVER WITH GUIDING AIR FLOW STRUCTURE

(75) Inventor: Yao-Ting Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 59 days.

(21) Appl. No.: 13/457,702

(22) Filed: Apr. 27, 2012

(65) Prior Publication Data
US 2013/0170137 A1 Jul. 4, 2013

(30) Foreign Application Priority Data
Dec. 28, 2011 (TW) .................... 100149165

(51) Int. Cl.
*H05K 7/20* (2006.01)
(52) U.S. Cl.
USPC .......................................... 361/694; 361/690

(58) Field of Classification Search
USPC .......................................................... 361/695
See application file for complete search history.

(56) References Cited

U.S. PATENT DOCUMENTS

| | | | |
|---|---|---|---|
| 6,934,150 B2 * | 8/2005 | Kitchen et al. | 361/679.33 |
| 6,989,988 B2 * | 1/2006 | Arbogast et al. | 361/695 |
| 7,120,018 B2 * | 10/2006 | Shen et al. | 361/695 |
| 7,848,101 B2 * | 12/2010 | Dey et al. | 361/679.51 |
| 7,929,304 B2 * | 4/2011 | Cao et al. | 361/697 |
| 2009/0027852 A1 * | 1/2009 | Roesner et al. | 361/690 |
| 2012/0140408 A1 * | 6/2012 | Chang | 361/679.53 |

* cited by examiner

*Primary Examiner* — Gregory Thompson
(74) *Attorney, Agent, or Firm* — Altis Law Group, Inc.

(57) ABSTRACT

An electronic device includes a chassis, a number of electronic components, and at least one block. The at least one block is fitted between two of the electronic components. At least one air flow passage is defined under the at least one block to direct air flow to enter between the two electronic components.

10 Claims, 6 Drawing Sheets

SERVER WITH GUIDING AIR FLOW STRUCTURE

BACKGROUND

1. Technical Field

The disclosure generally relates to servers, particularly to a server including a guiding air flow structure for guiding airflow to electronic components that may easily overheat.

2. Description of Related Art

Many electronic components in an electronic device generate heat when operating. Therefore, when designing an electronic device, cooling systems designed in to dissipate heat generated by the electronic components to prevent the electronic components from overheating.

Many cooling systems include fans configured to force air to flow past the electronic components which are cooled accordingly. However, when there are many electronic components in the electronic device, the fans cannot always uniformly direct the air flow to each electronic component for dissipating heat.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary server including guiding air flow structure. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
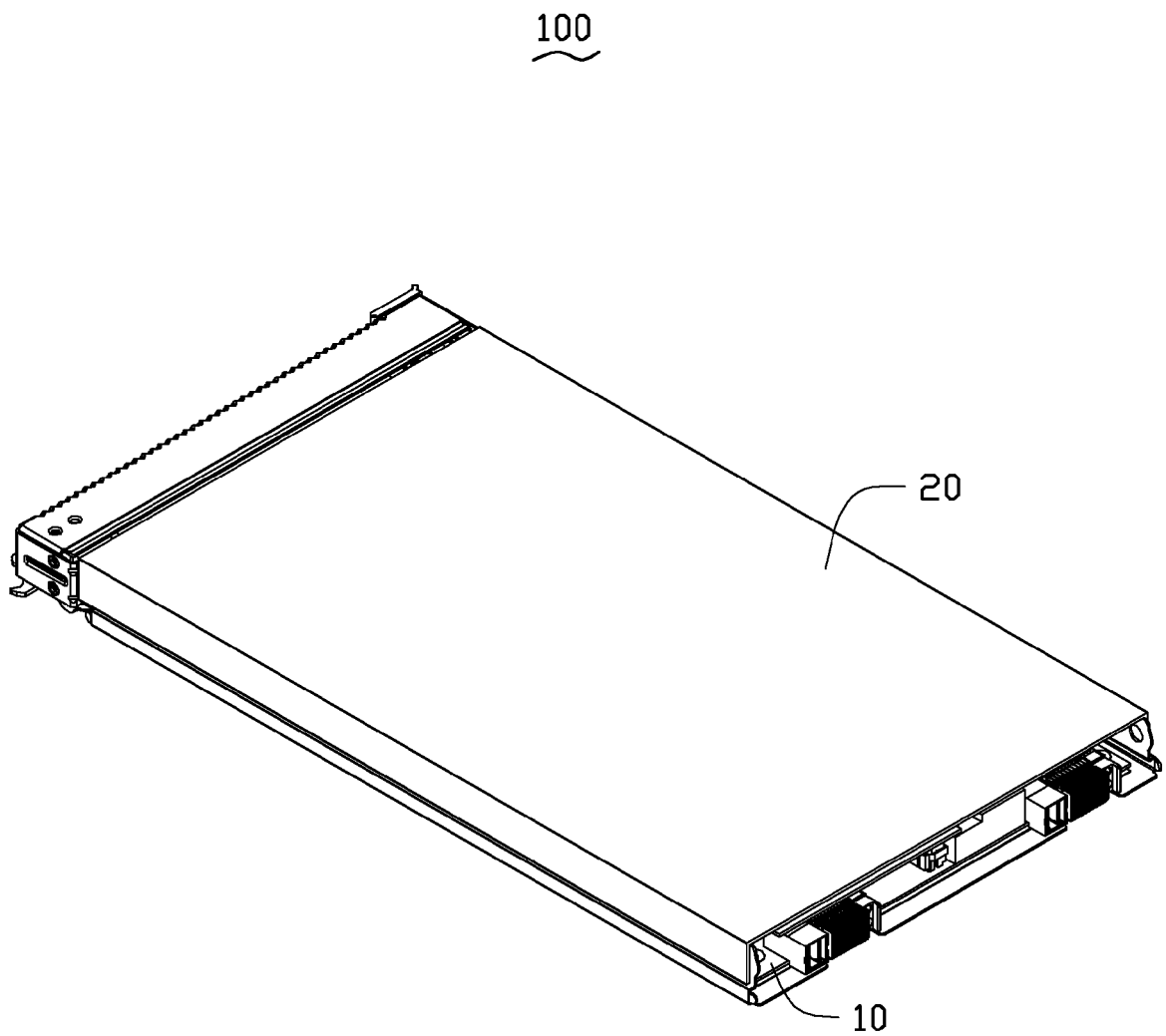
FIG. 1 is a schematic view of an embodiment of an assembled server.
Figure 2:
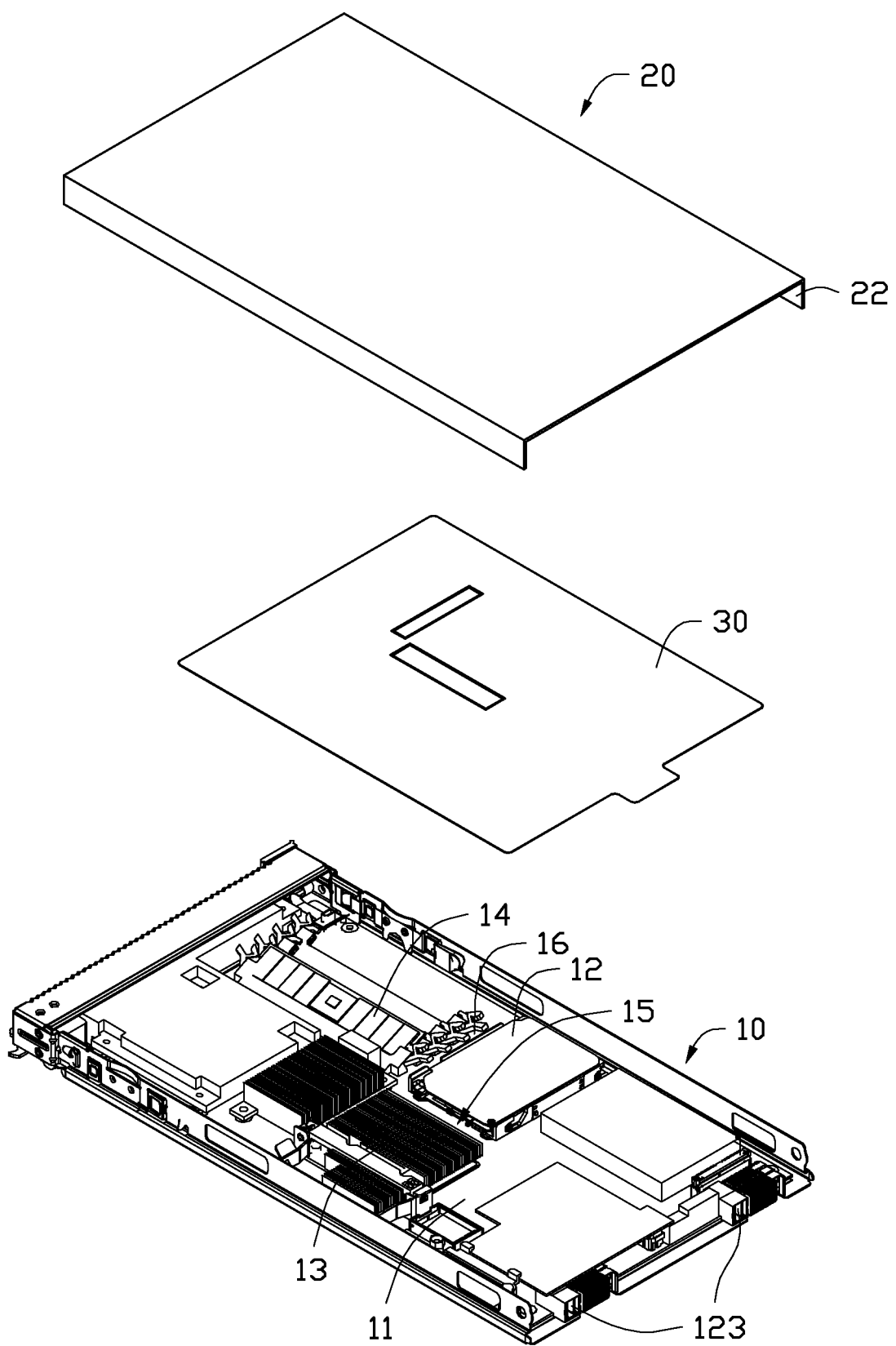
FIG. 2 is an exploded view of the assembled server in FIG. 1.

Referring to FIGS. 1 and 2, a server 100 includes a chassis 10, a cover 20, and an inside plate 30. The chassis 10 includes a motherboard 11, a number of electronic components 12, 13, 14, and a number of fans 123. The electronic components 12, 13, 14 are mounted on the motherboard 11. The fans 123 are mounted on one end of the motherboard 11 for dissipating heat.

In the exemplary embodiment, the first electronic component 12 is a power supply disposed on the motherboard 11. The second electronic component 13 is a hard disk, and the third electronic component 14 is a memory. A first clearance 15 is defined between the first electronic component 12 and the second electronic component 13. A second clearance 16 is defined between the first electronic component 12 and the third electronic component 14.

Figure 3:
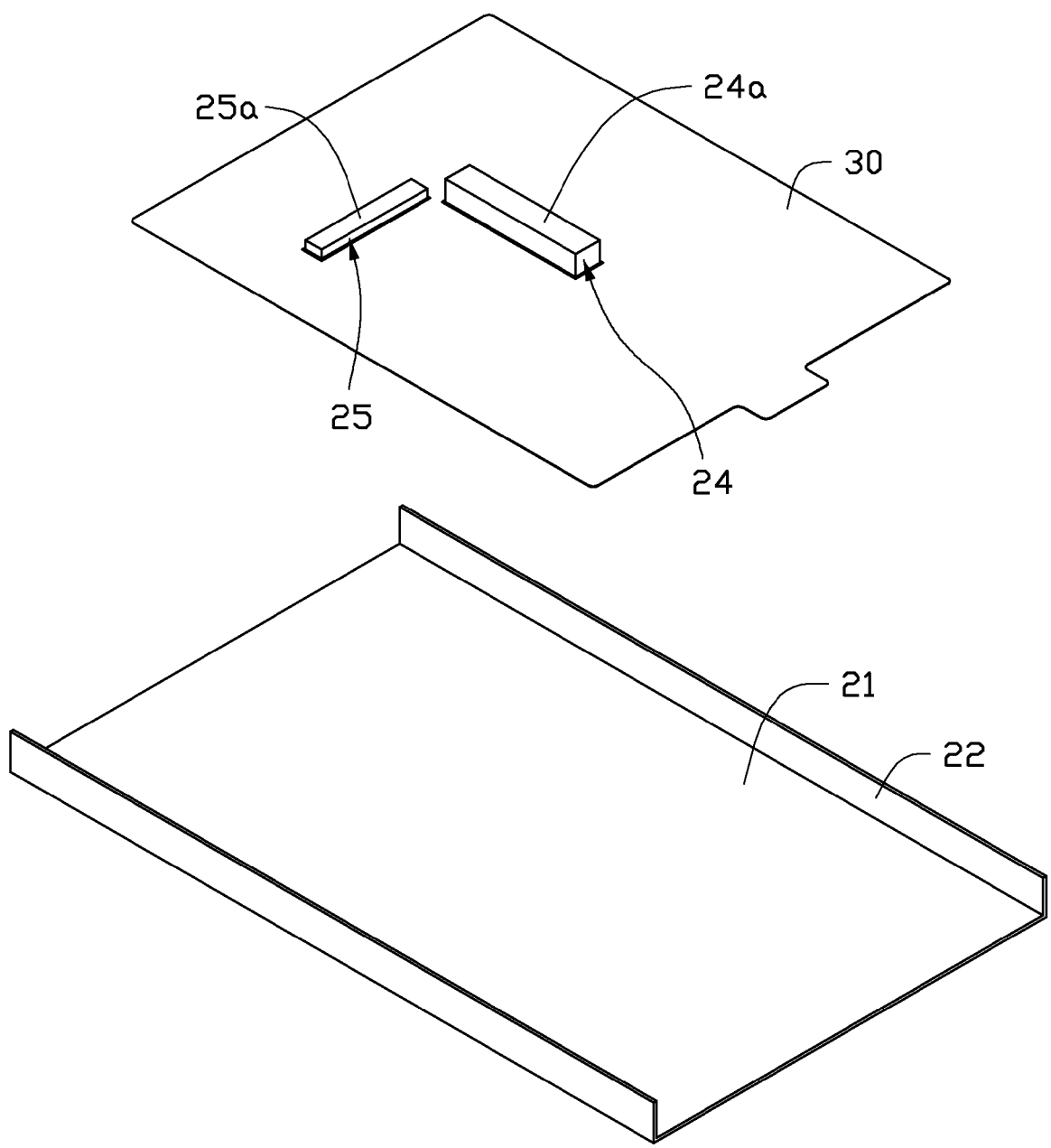
FIG. 3 is a schematic view of the cover and the inside plate in FIG. 2.
Figure 4:
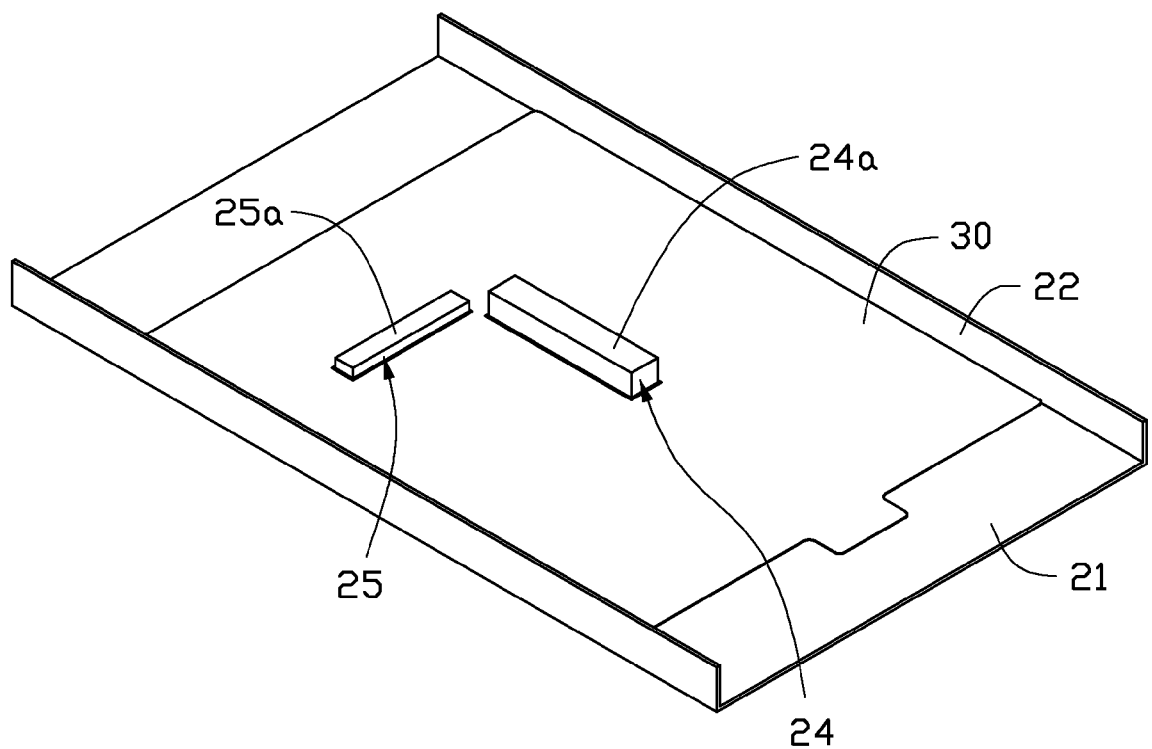
FIG. 4 is a schematic view of the inside plate mounted on the cover in FIG. 3.

Referring to FIGS. 3 and 4, the cover 20 includes a main plate 21 and two opposite sidewalls 22 extending from opposite sides of the main plate 21. The cover 20 is used for covering the chassis 10. The inside plate 30 is mounted on the main plate 21 of the cover 20 by adhesive. A first bock 24 and a second block 25 are formed on the inside plate 30 for being received in the first clearance 15 and the second clearance 16. The first block 24 and the second block 25 each have a main face 24a, 25a and are made of a flexible insulating material, such as rubber. Thus, the first block 24 and the second block 25 can be deformedly pushed to be easily received in the first clearance 15 and the second clearance 16. Additionally, the insulating characteristic of the first block 24 and the second block 25 may prevent the electronic components from short circuiting. The shape and the arrangement of the first block 24 and the second block 25 are similar to that of the first clearance 15 and the second clearance 16. In this exemplary embodiment, the first block 24 and the second block 25 are rectangular strips.

Figure 5:
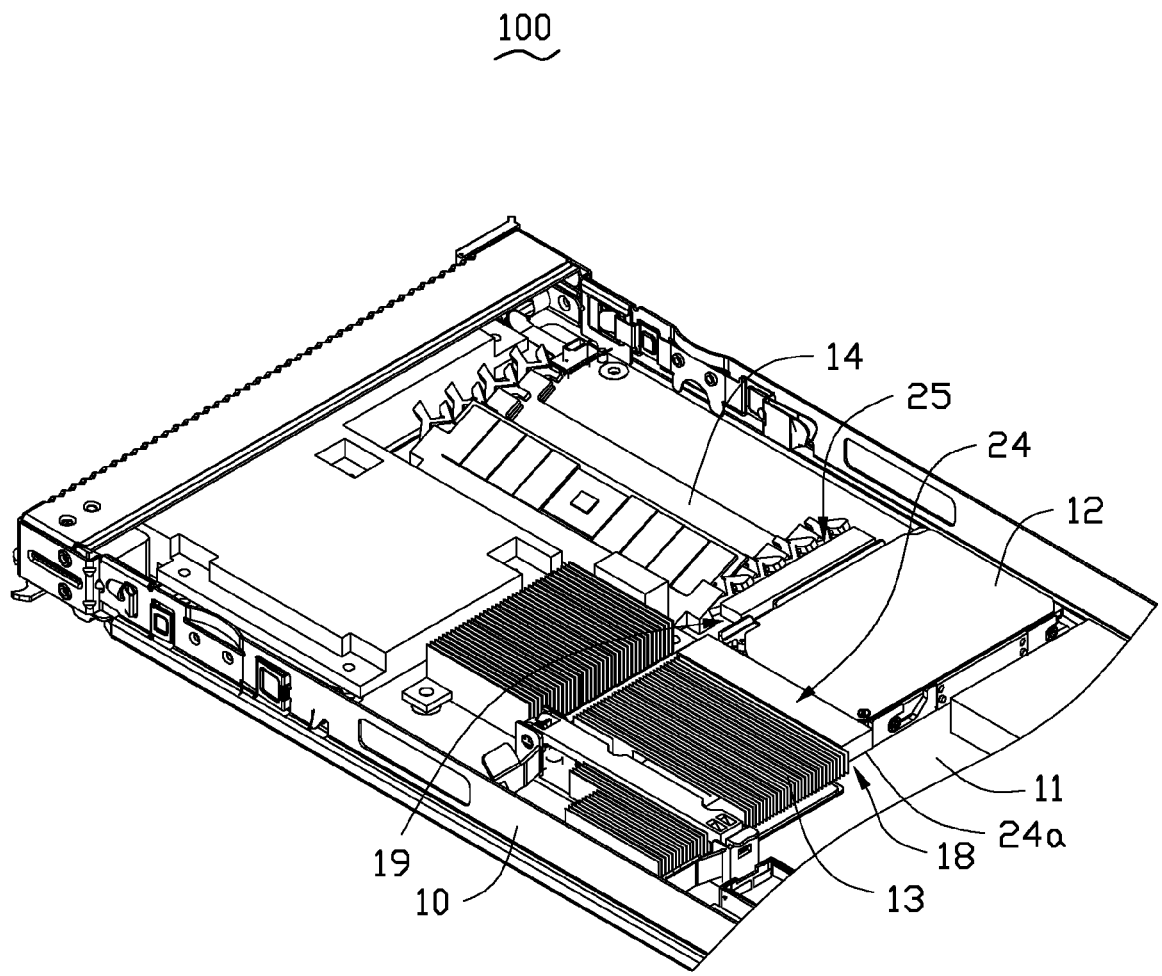
FIG. 5 is a schematic view of the blocks sandwiched between the electronic components omitting the inside plate.
Figure 6:
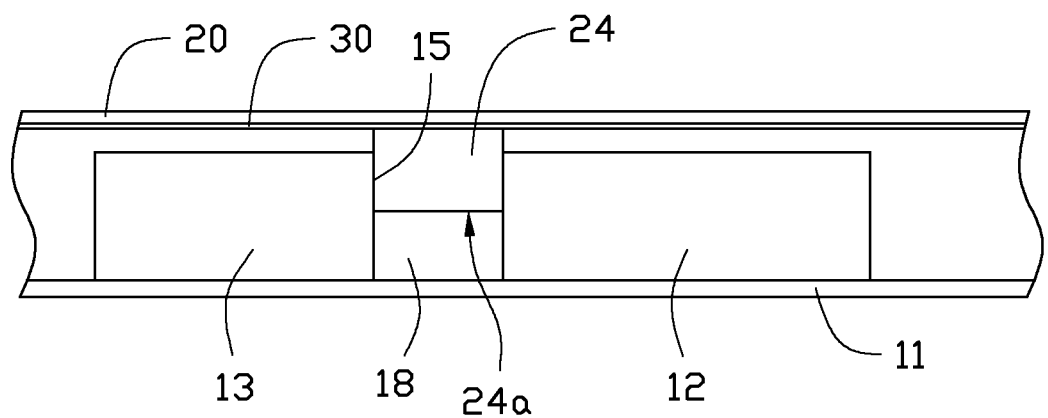
FIG. 6 is a simplified side view of one of the blocks sandwiched between the electronic components and spaced apart from the motherboard.

To assemble the first block 24 and the second block 25 to the chassis 10, as shown in FIG. 3, the inside plate 30 is firstly mounted on the cover 20 by adhesive. As shown in FIGS. 1, 5-6, the cover 20 with the inside plate 30 is positioned on the chassis 10. The first block 24 is received in the first clearance 15, and its main face 24a is spaced apart from the motherboard 11. Thus, a first airflow passage 18 is defined between the first electronic component 12 and the second electronic component 13. The second block 25 is received in the second clearance 16, and its main face 25a is also spaced apart from the motherboard 11. Thus, a second air flow passage 19 is defined between the first electronic component 12 and the third electronic component 14.

In use, when the fans 123 are operating, the first block 24 and the second block 25 to direct airflow from the fans 123 to respectively enter the first airflow passage 18 and the second air flow passage 19. The airflow in first air flow passage 18 and the second air flow passage 19 is further directed to the electronic components 12, 13 and 14 for dissipating heat.

During testing of a conventional server 100, it was found that the first clearance 15 and the second clearance 16 easily get hot. However, with the current design of the first block 24 and the second block 25, the airflow of the fans 123 can be more precisely directed to the predetermined airflow passages for dissipating heat. Thus, the air flow of the fans 123 can be effectively allocated to cool the various electronic components.

It is to be understood, however, that even through numerous characteristics and advantages of the disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An electronic device, comprising:
   a chassis;
   a plurality of electronic components;
   at least one block fitted between two of the electronic components, the at least one block having a main face;
   wherein at least one air flow passage is defined under the main face of the at least one block to direct an air flow between the two electronic components.

2. The electronic device as claimed in claim 1, further comprising an inside plate, wherein the at least one block is mounted on the inside plate.

3. The electronic device as claimed in claim 2, further comprising a cover, wherein the cover is attached on the chassis, and the inside plate is mounted on the cover by adhesive.

4. The electronic device as claimed in claim 1, wherein the at least one block is made of flexible insulating material.

5. The electronic device as claimed in claim 4, wherein the at least one block is made of rubber.

6. An electronic device, comprising:
- a chassis including a motherboard, a plurality of electronic components, and a number of fans, the electronic components mounted on the motherboard, the fans mounted on one end of the motherboard, a first clearance and a second clearance defined between the electronic components;
- a first block and a second block, each of the first block and the second block having a main face and respectively fitted in the first clearance and the second clearance and the main faces spaced apart from the motherboard to define a first air flow passage and a second air flow passage;
- wherein air flow of the fans is directed to respectively enter the first air flow passage and the second air flow passage for dissipating heat.

7. The electronic device as claimed in claim 6, further comprising an inside plate, wherein the at least one block is mounted on the inside plate.

8. The electronic device as claimed in claim 7, further comprising a cover, wherein the cover is attached on the chassis, and the inside plate is mounted on the cover by adhesive.

9. The electronic device as claimed in claim 6, wherein the at least one block is made of flexible insulating material.

10. The electronic device as claimed in claim 9, wherein the at least one block is made of rubber.

* * * * *